Sept. 11, 1962 A. FRIEDMAN 3,053,929
PRINTED CIRCUIT
Filed May 13, 1957
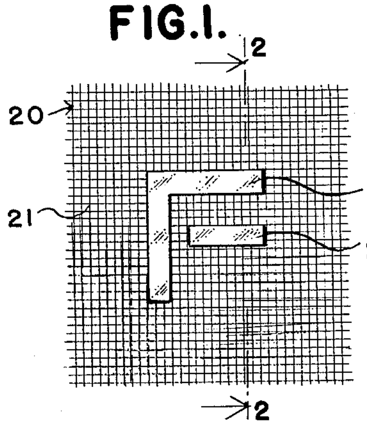
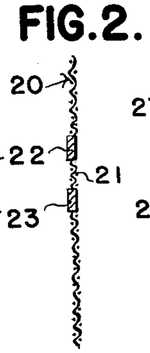
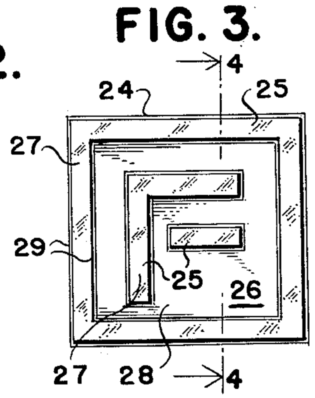
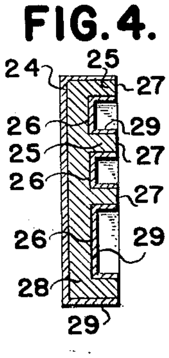
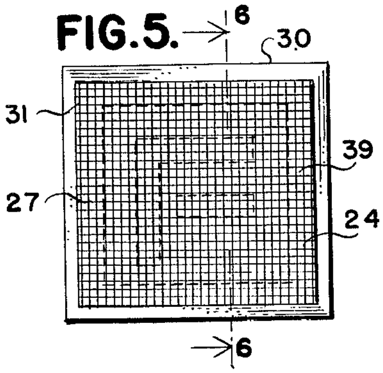
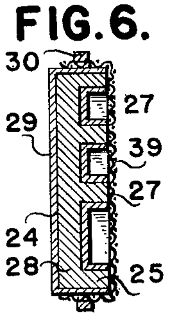
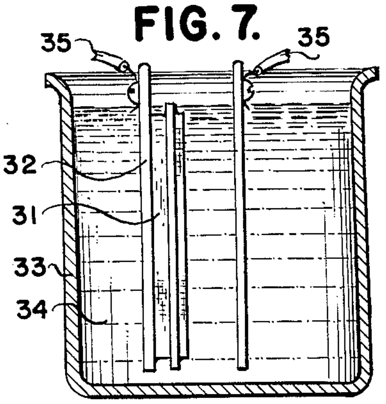
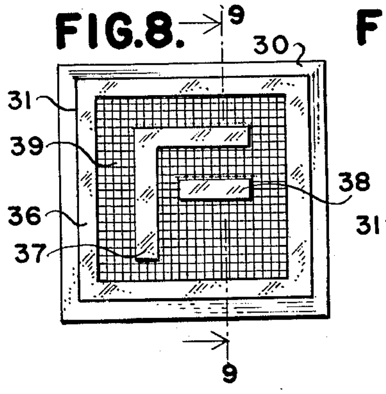
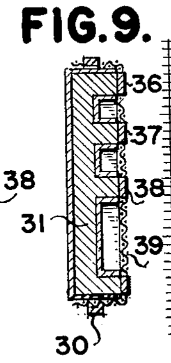
FIG.10
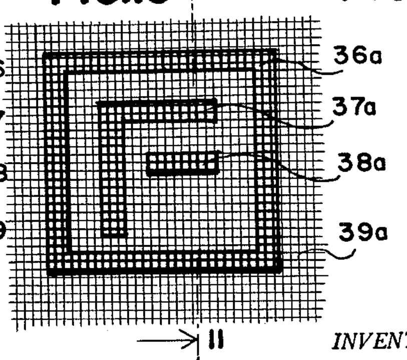
FIG.11.
INVENTOR.
Abraham Friedman 3,053,929
Patented Sept. 11, 1962

3,053,929

PRINTED CIRCUIT

Abraham Friedman, 26 Court St., Brooklyn, N.Y.

Filed May 13, 1957, Ser. No. 658,739
2 Claims. (Cl. 174—68.5)

This invention relates to a printed circuit and more particularly to a basic printed circuit element, wherein a conductive pattern is disposed upon a reticulated or foraminous supporting element and to a method for forming the same.

The term "printed circuit" has been applied to a wide variety of wiring arrangements for electrical circuits which have the common characteristic of providing a pattern of electrically conductive material disposed upon some form of insulating base or support. The electrically conductive pattern serves to interconnect the variety of circuit components employed in electrical and electronic circuitry to thereby form complete circuit systems or arrangements. Numerous methods have also been suggested for the formation of such circuits in order to meet the wide variety of problems encountered in their production and application. However, none of these is deemed to be completely satisfactory solution for the economic, mechanical and electrical problems involved.

It is, therefore, an object of this invention to provide a printed circuit and a method for forming the same, which circuit may be readily and economically produced on a large scale and possesses advantageous mechanical and electrical properties.

It is a further object of this invention to provide a printed circuit and a method for forming the same wherein an electrically conductive pattern is disposed upon a reticulated or foraminous supporting element or base in a simple, efficient and economically producible manner.

Another object of this invention is to provide a printed circuit of the character indicated, wherein the electrically conductive circuit pattern appears upon both sides of the supporting base element carrying it; said pattern being accessible along both of said surfaces for contact and interconnection with similar printed circuit elements in stacked or similar relation and for interconnection with other circuit components.

A still further object of this invention is to provide a printed circuit of the character indicated which by reason of its construction forms a highly efficient and well bonded support for the conductive circuit pattern and permits the circuit element to be further supported by impregnation or lamination with other materials or upon additional supporting elements, in a highly efficient manner.

It is also an object of this invention to provide a printed circuit element of the character indicated which is capable of being assembled in interleaved relation with similar circuit elements or with other circuit components all of which may be readily united into a solid cohesive mass as by impregnation, encapsulation or potting and which is adapted to provide three-dimensional circuit pattern arrangements including cross-overs.

A still further object of this invention is to provide a printed circuit element which may be formed by a convenient method, using a variety of materials and wherein the conductive pattern or the foraminous support therefor may be further covered, coated or otherwise treated in accordance with the requirements of the particular application.

Other and further objects, benefits and advantages of this invention will become apparent from the description thereof contained in the annexed drawings, specifications and claims or will otherwise become obvious.

In the accompanying drawings, wherein some parts have been somewhat exaggerated for purpose of clarity:

FIGURE 1 is a plan view of a printed circuit in accordance with the present invention;

FIGURE 2 is a cross-section of FIGURE 1 taken along line 2—2 thereof;

FIGURE 3 is a plan view of a cathode plate for the formation of a circuit pattern in accordance with the present invention.

FIGURE 4 is a cross-section of FIGURE 3 taken along line 4—4 thereof;

FIGURE 5 is a plan view of the assembly of a foraminous supporting sheet with the plating cathode;

FIGURE 6 is a cross-section of FIGURE 5 taken along line 6—6 thereof;

FIGURE 7 is a cross-sectional view of a plating tank showing the cathode assembly disposed therein;

FIGURE 8 is a plan view of the cathode assembly removed from the plating tank after the plating has been completed;

FIGURE 9 is a cross-section of FIGURE 8 taken along line 9—9 thereof;

FIGURE 10 is a plan view of the printed circuit wherein the conductive areas are foraminous;

FIGURE 11 is a cross-section of FIGURE 10 taken along line 11—11 thereof.

FIGURES 1 and 2 illustrate a printed circuit or printed circuit element in accordance with the present invention. As may be seen from said figures, the printed circuit designated generally by the numeral 20 comprises a reticulated or foraminous insulating support 21 upon which there has been disposed the conductors 22 and 23. Conductors 22 and 23 are formed of a suitable electrically conducting material and when the plating method hereinafter to be described is employed, said conductors would be formed of copper or other electrolytically deposited metal. The particular configuration of the conductors shown is for illustrative purposes only and it will, of course, be understood that the conductors may be of any number and formed in any desired configuration or pattern in accordance with the requirements of the particular circuit arrangement. In the form of the invention illustrated in FIGURES 1 and 2, the foraminous material employed as insulating support 21, comprises a woven fabric and it will be more particularly seen from FIGURE 2 that the conductors formed thereon surround the fibers or threads of the fabric and are disposed within the interstices thereof. Furthermore, it will be noted that portions of the conductors 22 and 23 extend through the fabric and are exposed along both surfaces of the fabric. This arrangement permits electrical connections to other components to be made along either or both surfaces of the conductors and further permits the stacking of similar printed circuit elements and their interconnection as by contact at suitable points.

The foraminous reticulated supporting sheet 21 constitutes an electrical insulator and advantageously comprises a woven fabric, such as for example, glass cloth. It will, however, be understood that other forms of fabric or sheet material may be employed, and that electrically insulating natural or synthetic fibers as well as suitable porous, apertured or perforated sheets of such material are useful in the practice of the instant invention. The degree of porosity or mesh of the fabric may vary with the requirements particular application, depending upon the width of the conductors to be disposed thereon and the spacing therebetween. When woven fabrics are employed, weaves such as those employed in cloth used for silk screening have been found to be suitable and such fabrics formed with mesh of from 25 to 200 threads per lineal inch have been found to be quite useful. In this connection, it is significant that the use of glass cloth is particularly advantageous in view of its good electrical insulating characteristics and high tensile strength.

The type of printed circuit comprising the present invention may advantageously be produced by the method which will now be described and which is illustrated in FIGURES 3–9 of the drawings. In the employment of this method, a printed circuit, such as that shown in FIGURES 1 and 2, is produced by the electrodeposition of a metal such as copper on the mesh and in the interstices of the foraminous supporting sheet and in accordance with the desired pattern. In this connection, it should be noted that it is characteristic of a printed circuit pattern that a plurality of conductors are provided which are insulated from each other and form discrete and isolated conductive regions. By reason of this physical characteristic, considerable difficulty has been encountered in the past in the formation of such circuit upon an insulating base, particularly by plating methods.

In its broad outline, the initial method to be described for forming this printed circuit employs a cathode plate 24 upon which there has been engraved the configuration of the desired printed circuit pattern. The relieved or raised areas 25 of the plate define the configuration of the conductive elements of the circuit, whereas the intaglio or depressed areas 26 define the insulating areas therebetween. Although the pattern may be imposed upon the plate 24 by milling or conventional pantograph engraving methods, it has been found convenient and economical to employ methods well known and practiced in the printing and electrotyping art. Thus, plate 24 is advantageously formed by first making a black and white drawing of the desired pattern. From this drawing a photo-engraving such as is in standard use in the printing industry, is made. Thus, as the drawing is made with the black ink portions defining the desired conductive pattern, the resultant photo-engraving will be formed with raised areas conforming to said conductive pattern. The photo-engraving thus formed may be directly employed in the instant method. However, in order to facilitate economical large scale production, said engraving is advantageously used as a master to form as many duplicates as desired by standard electroforming or electrotyping methods. The use of electrotypes constitutes a relatively inexpensive method of producing the instant printed circuit upon a large scale. An electrotype of this character constitutes a copper shell which reproduces the configuration of the original master, said shell being usually backed up with a lower melting point metal which is cast into the back of the shell for additional support. The plate 24 thus constitutes a metal or electroconductive body which bears the desired circuit pattern configuration in raised form and is capable of functioning as a cathode for the electrodeposition of a desired metal upon the face areas 27 thereof. It should be noted that the face areas of the raised portions of the plate represent the circuit pattern and although these face areas are isolated from each other, electrical continuity is achieved therebetween through the base 28 of the plate.

In order to prevent the deposition of metal upon the undesired areas of the plate an insulating stop-off coating 29 is applied upon all of the exposed surfaces of the plate except the face areas 27 upon which deposition of metal is desired. Stop-off coatings of this type are well known and commercially available in the electroplating and electroforming industry. Such stop-off material usually comprises a coating or lacquer having synthetic resin base, such as for example, polyvinyl chloride or it may comprise an asphaltum or bituminous material. As stated, the stop-off coating prevents the electrodeposition of metal upon the coated surfaces and limits such deposition to the desired face areas comprising the printed circuit pattern.

In order to facilitate the removal of the metal to be deposited upon the face areas 27, there is applied to the face areas 27 a separation layer or film. Such separation layers or films are well known and used in the electroplating and particularly in the electroforming art. A simple form of separation layer comprises a layer of graphite which may advantageously be applied in the form of a colloidal dispersion of graphite in water. Other separation media, a film such as metallic silver which is applied by simultaneously spraying a solution of silver nitrate and a reducing agent such as a sugar or formaldehyde upon the surface which is first sensitized by applying stannous chloride thereto. Still other methods comprise the formation of a conductive metal sulphide salt on the cathode plating surface. A further separation treatment is to initially plate a layer of adherent chromium upon said face which is said to form natural oxides on the face thereof without further treatment. The deposited metal separates readily from the chromium surface.

As shown in FIGURES 5 and 6, a sheet of foraminous material 39 comprising the insulating support for the conductive circuit pattern as heretofore described is then applied to the pattern face 27 of cathode plate 24. The foraminous sheet or insulating support 39 advantageously comprises a sheet of glass cloth having an open mesh weave. Said fabric 39 is drawn tightly around the marginal edges of the plate 24 and a clamping ring 30 is forced over the plate edges to clamp the cloth in position and draw it tightly against the pattern bearing face 27 of the plate. Although it is preferred to form the clamping ring 30 of rubber or similar elastomeric material, other suitable materials may be employed for this purpose. The plate 24 and clamped fabric 39 thus form a cathode plate assembly designated generally by the numeral 31 and an electrode 32 is applied to the back of the plate, as shown in FIGURE 7. Electrical contact is made between the cathode plate 24 and electrode 32 by removing a portion of the stop-off material 29 for this purpose or by previously providing an exposed area therefor. The entire cathode assembly 31 and its associated electrode 32 are then introduced into a plating tank 33 containing a suitable plating solution or electrolyte 34. The plating solution is of standard composition for the desired metal to be deposited and such solutions are so well known in the plating and allied arts to require no further description here. A copper sulphate-sulphuric acid bath may be employed for copper deposition. A suitable anode, as of copper, is introduced into the plating bath and each of the electrodes is then connected to a suitable current source, not shown, by means of conduits 35.

With the arrangement disposed as shown in FIGURE 7, plating current is initiated, and since the plating electrolyte passes freely through the fabric mesh, deposition of metal occurs upon the pattern face areas 27 of the cathode plate 24. The efficiency of the plating action may be increased by agitating the plating electrolyte or by directing a stream thereof against the pattern face. As the plating action proceeds, the metal deposit enters the interstices of the fabric and forms around the threads or fibers thereof, thereby forming a mechanical bond between the fabric and the metal deposit. As the plating action is further continued, the thickness of the plated metal increases and overlaps the outer surfaces of the fabric threads thereby increasing the bond. The plating action is continued until the desired thickness of metal is achieved, whereupon the cathode assembly is removed from the plating tank; its plated condition being illustrated in FIGURES 8 and 9. It will be seen from said figures that the deposit of metal has been limited to the desired printed circuit conductor pattern areas 36, 37 and 38. The removal of the clamping ring permits the fabric 39 to be peeled from the cathode plate integrally with the printed circuit conductors 36, 37 and 38 which separate readily from the cathode plate. In this connection it should be noted that where it is desired to form a heavier underlying deposit of metal before the metal is deposited in the interstices of the cloth such film deposit is formed by merely plating the face of the cathode plate with a layer of metal of the desired thickness prior to affixing the fabric to the cathode plate. Under these circumstances, when plating is resumed, the deposit entering the interstices is bonded to the underlying previously deposited metal and said underlying layer thus forms an integral part of the printed circuit pattern giving it the desired additional thickness. If a surface coating of different metal is desired, it may be plated on before removal of the cloth from the plate.

The resultant printed circuit is illustrated in FIGURES 8 and 9. It will be seen from said figures that there is disposed upon the insulating glass fabric 39 a conductive printed circuit pattern comprised of discrete or isolated areas of 36, 37 and 38 conductive material in the form of metallic copper in this instance, and that said conductive material is exposed for electrical interconnection or contact on both surfaces of the cloth. The metallic deposits surrounds the threads of the fabric and enters the interstices thereof, thereby forming a firm bond therebetween. The printed circuit shown in FIGURES 8 and 9 thus comprises a foundation sheet of insulating supporting foraminous material 39 which carries conductors 36, 37 and 38 disposed thereon in accordance with the desired pattern. The printed circuit may be employed without further modification and other circuit components may be secured to the conductive areas as by soldering. Holes may be punched in desired areas for permitting the insertion of leads or components may otherwise be attached either to the conductors or to the supporting sheet. As heretofore stated, the pattern shown is for illustrative purposes only and any desired pattern may be formed including patterns wherein the conductors are provided with openings for the insertion and interconnection of other components. Furthermore, it will be apparent that other printed circuit elements bearing related patterns may be super-imposed in stacked relation thereon and electrical connection made at points of contact of the conductors with each other. Thus, for example, the conductors may be readily tinned and solder coated and the application of heat to contacting conductors will form a mechanical and electrical connection therebetween. When a flexible fabric is employed, the entire circuit may be flexed or deformed to varying shapes. Thus, cylindrical printed circuits can be readily formed and angular bends made without any difficulty. As heretofore indicated, a very wide variety of materials is available for use as a supporting base or sheet. In addition to fabrics, perforated or apertured sheets and alike, glass matting and unwoven porous sheeting may be employed. Where an initially more rigid circuit is desired, the fibers or threads of a flexible cloth may be treated with a resin or other material, thus imparting a desired degree of rigidity to said filaments upon which the metal is then deposited. Screening formed of relatively heavy monofilaments may also be employed as the insulating support where greater initial rigidity is desired. The printed circuit element in any of these forms may be applied to conventional forms of phenolic or epoxy impregnated printed circuit boards or upon other forms of supporting material such as sheets or blocks of synthetic resin, ceramics or glass. In all of these instances the completed printed circuit element may be more readily adhered to such surfaces by reason of the foraminous insulating support which is capable of forming a secure bond therewith. If the circuit is to be applied to an additional supporting board such as a laminated board, the application thereof may be made during the laminating process. It will be understood, of course, that if the circuit is to be applied to a supporting panel, where only one side thereof is exposed, it is not essential that the metal extend completely through the unexposed side thereof and the degree of plating may be limited. A desirable characteristic of this type of printed circuit, when initially formed on a flexible supporting fabric, is that it may be folded around a supporting panel so as to provide circuit continuities which pass around an edge of the panel thereby forming a continuous circuit along both sides of the panel.

Another interesting feature of this circuit when it is folded around such panel is that the conductors passing around the edge of the panel may be used as contacts for interconnecting panels with each other or for permitting the panel to be inserted and removed from plug-in recaptacles without the necessity of any special structure on the printed circuit panel for this purpose.

The printed circuit support may be variously treated either before or after plating to provide numerous physical characteristics or arrangements. Thus, for example, prior to plating the fabric, the areas which will not be occupied by conductors may be filled in with a synthetic resin as by impregnation, spraying or coating through a stencil or silk screen, and after cure the supporting fabric may be applied to the cathode plate and the conductive areas plated thereon in the manner heretofore indicated. In this manner there may be formed a printed circuit panel having the physical characteristics of rigidity etc. of the laminate thus formed in the insulated areas. In an alternative method the resin may be similarly applied after the conductors have been plated upon the fabric to form the panel. Additionally, by use of a suitable glass cloth, the insulated areas may be filled in with a ceramic material and subjected to high temperatures whereby the ceramic is fused. In another method of forming a ceramic printed circuit, the printed circuit element may be applied to a ceramic plate by means of a suitable cement and again, if necessary, subjected to high temperatures in order to effectuate the desired bond strength or fusion. The foraminous support as well as the conductors may become integrated into the very body of the additional supporting material or panel. Where a plurality of circuit elements are disposed in stacked relation, the entire stack may be encapsulated or potted. In such case, potting material can flow through the interstices of the fabric and permits the formation of solid mass within which the circuit is rigidly incorporated.

An additional feature of this type of circuit is that it permits the mounting of additional circuit components in numerous and novel ways, thus for example, capacitors or resistors in the form of wafers may be interposed between two parallel circuit elements and connected in position by merely heating a previously applied solder film on the contact areas. There thus results a novel form of sandwich circuit construction wherein components are interposed between printed circuit elements and directly soldered to form an integrated circuit arrangement which may then, if desired, be further encapsulated.

In addition to the method herein above described for the formation of the instant printed circuit element, other methods may be employed with varying advantage. Furthermore, the method herein above described can be employed with modifications. Thus for example, in order to facilitate the deposition of metal upon the surface of the threads forming the fabric and in the interstices thereof, the cathode plate assembly shown in FIGURE 5 may have applied thereto a coating of conductive material. In this modified form of the invention, a silk screen or stencil is formed, having open areas corresponding to the conductive portions of the printed circuit pattern. Such screen or stencil is then disposed upon the fabric on the face of the cathode plate assembly and a conductive coating material, such as for example, a colloidal dispersion of graphite in water, is then applied through such screen or stencil to the face of the assembly. As a consequence of this, the threads upon which the conductive portion of the pattern is to be deposited are rendered conductive and a continuous graphite film is formed with exposed areas of the plate therebetween. When the cathode assembly has been thus treated and is subject to plating action, the metal deposit forms almost immediately around the circumference of the threads and spans the areas therebetween more readily with a firmer bond. In this case, the degree of plating may be limited since both surfaces of the fabric are covered with the metal deposit more readily. Another feature of limiting the plating in this manner is that the grid structure of the fabric is retained on at least one surface so as to permit the more ready adhesion and firmer mechanical bonding of the printed circuit element to a supporting sheet. The aforementioned procedure may be further varied as by applying the pattern of conductive coating material to the fabric or foraminous sheet prior to mounting it upon the cathode plate. The conductive pattern is screened or stenciled upon the fabric with a conductive ink or paste or by any other suitable means for rendering at least the surface of the threads conductive in accordance with the desired pattern. After such conductive pattern has been applied to the threads, as for example, by means of the aforementioned graphite, the fabric is mounted upon the cathode plate and the surface contact between the plate and the fabric is adequate to initiate plating thereon. Where this method is employed, a modified form of the printed circuit element may, if desired, be derived. Where the conductive pattern is first applied to the fabric, it has been found that the metal deposits around the fabric threads before a bond occurs with the underlying face of the plate which is being simultaneously plated. If the plating action is discontinued before this bond occurs, a printed circuit element results wherein the threads comprising the conductive pattern are surrounded and completely encased in the plated metal. However as shown in FIGURES 10 and 11, the metal does not, at this point in the process, completely fill the interstices of the fabric *39a*, thus, each of the conductors of the pattern is foraminous in nature and has the qualities of a metal screen. For many purposes, this type of arrangement is adequate and in some circumstances possesses distinct advantages. The advantage of providing foraminous conductors *36a*, *37a* and *38a* for the printed circuit element resides in the fact that it may then readily be bonded to another material since the material itself or the bonding agent comprising an adhesive or cement is thus enabled to enter the interstices of the conductor itself and to form a highly efficient mechanical bond therewith. Furthermore, a printed circuit element whereon the conductors themselves are foraminous permits a more complete encapsulation of the circuit since the encapsulating material may then enter such interstices. Another feature which in many circumstances presents distinct advantages is that the foraminous conductive portions permit the soldering of contacts and connections from either side of the conductor and provide for a more efficient bond with the solder which is thus enabled to flow into the interstices of the conductor.

It is desirable in many instances to form a printed circuit wherein the conductive elements themselves are also foraminous. Under such circumstances, it is expedient to eliminate the engraved or specially formed cathode plate. To form a conductive pattern of this character, the conductive pattern is first coated to the fabric threads by means of a conductive ink, paste or conductive metal deposit, through a silk or similar screen or stencil as heretofore indicated. The fabric is then mounted upon and in contact with a metallic plate which is then immersed in a plating bath. It has been found that adequate electrical continuity is thus established between the conductively coated portions of the threads and the metal plate so that plating occurs simultaneously upon said portions of the threads and upon the backing plate. The deposit of metal upon the fabric will be limited to the conductively coated areas. The plating action is discontinued before any bond occurs between the metal deposited on the conductive backing plate and the metal deposited on the threads in the desired areas. The resultant product is similar in all respects to that heretofore described and comprises a conductive foraminous circuit pattern formed upon the foundation of the foraminous supporting insulating sheet.

Another modified method for forming a printed circuit element of the character herein indicated which dispenses with an engraved type of cathode plate comprises the use of a metal plate upon which a stop-off material has been applied as by silk screening on the areas where conductors are not desired. The surface of the metal plate conforming to the desired conductive circuit pattern is left exposed. A foraminous sheet is then pressed against the face of the metal plate and the plating action is initiated. The plating will, of course, occur in the uncoated portions of the plate corresponding to the desired conductive pattern, since the other areas are blocked off by the stop-off material. Plating is continued until a bond occurs with the fabric threads. Here again the plating action may be facilitated and the required degree of plating reduced if prior to mounting the fabric upon the plate, the areas defining the conductive pattern are first coated with a conductive material in the manner heretofore indicated.

Conductive circuit elements having some of the advantages of the elements heretofore described may also be formed by silk screening or stenciling the desired conductive pattern upon the foraminous insulating support using a conductive paint or paste. Such conductive paints or pastes are commercially available and comprise dispersions of metals, such as silver or copper, in a carrier, such as a lacquer or synthetic resin. The carrier may be an air-dry material, a thermosetting material or it may require high temperatures to burn off the organic carrier and to fuse the metal. A higher conductivity may be achieved by fusing the metal of a dispersion. It has, however, been limited to supporting insulating materials which can stand the high temperatures required. Thus for example, the fusible silver conductive pastes have been limited in use to materials such as ceramics. In forming the printed circuit element of this invention, with this type conductive paint or paste, a silk screen or stencil is formed by conventional means wherein the open areas define the desired conductive pattern and the conductive paint or paste is applied therethrough onto the foraminous insulating support, such as glass fabric. To form a circuit wherein the conductors are foraminous, a low viscosity paint is employed which covers the threads and flows around them but does not span the interstices therebetween. To form a solid conductor for the conductive pattern, a higher viscosity material, such as conductive paste is employed. The conductive paste fills the interstices between the threads in addition to covering the threads themselves. The conductive paint or paste is then cured or fused in accordance with its characteristics. In using a glass cloth which has a high melting point, it is possible to use a fusible silver conductor. The circuit element thus formed may then be mounted on either a ceramic material or upon a backing panel which normally could not have been subjected to such fusion temperature. Printed circuits of this character may, of course, be employed without such additional backing as heretofore indicated depending upon the particular application.

A printed circuit element having some of the advantages of the herein described circuit may also be formed by utilizing a sheet of foraminous material with a plated coating of metal. An etching resist is then applied to said metal clad foraminous fabric by means of a silk screen, stencil or by photographic means as is well known in the printed circuit art. The etching resist is applied in a pattern covering the areas wherein conductors are desired and the remaining areas are then etched away. The resultant printed circuit element again comprises a conductive circuit pattern which is supported upon an insulating foraminous sheet material.

The use of a foraminous support also permits the formation of other circuit components integrally with the insulating portion of the circuit element. Thus, a resistance ink or paste may be applied to or screened upon the threads between appropriate conductors. Similarly, an appropriate dielectric material may be applied between conductors on the same circuit element or between stacked elements.

I have here shown and described a preferred embodiment of my invention. It will be apparent, however, that this invention is not limited to this embodiment, and that many changes, additions and modifications can be made in connection therewith without departing from the spirit and scope of the invention as herein disclosed and hereafter claimed.

I claim:

1. A printed circuit element comprising a base member formed of foraminous insulation material and an electrical conductor carried by said base member, said conductor being a discrete strip of foraminous conductive material in which the associated portion of the base member is substantially completely encompassed.

2. A printed circuit element comprising a base member formed of foraminous insulation material having mesh portions which define the foramens thereof, a plurality of electrical conductors carried by said base member, said conductors each comprising a discrete area of foraminous conductive material which encompasses the mesh portion of the associated area of the base member.

References Cited in the file of this patent

UNITED STATES PATENTS

| | | |
|---|---|---|
| 707,306 | Daly | Aug. 19, 1902 |
| 717,778 | Spaulding | Jan. 6, 1903 |
| 2,042,030 | Tainton | May 26, 1936 |
| 2,158,867 | Schwabacher | May 16, 1939 |
| 2,616,165 | Brennan | Nov. 4, 1952 |
| 2,699,424 | Nieter | Jan. 11, 1955 |
| 2,720,076 | Sachara | Oct. 11, 1955 |
| 2,728,693 | Cado | Dec. 27, 1955 |
| 2,793,178 | Morris | May 21, 1957 |
| 2,801,909 | Hirdler | Aug. 6, 1957 |
| 2,861,911 | Martin et al. | Nov. 25, 1958 |
| 2,884,571 | Hannahs | Apr. 28, 1959 |

FOREIGN PATENTS

| | | |
|---|---|---|
| 9,982 | Great Britain | of 1843 |
| 5,830 | Great Britain | of 1883 |
| 19,919 | Great Britain | of 1892 |
| 430 | Great Britain | of 1901 |
| 738,575 | Great Britain | Oct. 19, 1955 |

OTHER REFERENCES

Publication, Plating, Vol. 40, No. 7, July 1953, pages 765–766.